(12) United States Patent
Wang et al.

(10) Patent No.: US 12,262,582 B2
(45) Date of Patent: Mar. 25, 2025

(54) DISPLAY MODULE HAVING MAGNETIC ATTRACTION STRUCTURE AND BONDING PORTIONS AND DISPLAY DEVICE

(71) Applicant: BOE TECHNOLOGY GROUP CO., LTD., Beijing (CN)

(72) Inventors: Zifeng Wang, Beijing (CN); Lei Cao, Beijing (CN); Yao Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 364 days.

(21) Appl. No.: 17/612,288

(22) PCT Filed: Nov. 17, 2020

(86) PCT No.: PCT/CN2020/129408
§ 371 (c)(1),
(2) Date: Nov. 18, 2021

(87) PCT Pub. No.: WO2021/104109
PCT Pub. Date: Jun. 3, 2021

(65) Prior Publication Data
US 2022/0223819 A1    Jul. 14, 2022

(30) Foreign Application Priority Data
Nov. 25, 2019   (CN) .......................... 201922054126.8

(51) Int. Cl.
*H10K 50/84*       (2023.01)
*H10K 102/00*     (2023.01)

(52) U.S. Cl.
CPC ....... *H10K 50/84* (2023.02); *H10K 2102/311* (2023.02)

(58) Field of Classification Search
CPC ........ H10K 50/84; H10K 50/88; H10K 50/80; H10K 59/80; H10K 77/00; H10K 10/80;
(Continued)

(56) References Cited

U.S. PATENT DOCUMENTS

| 6,590,346 B1* | 7/2003 | Hadley | ................... H01L 24/82 |
| | | | 257/E21.705 |
| 9,660,215 B2* | 5/2017 | Gao | ....................... H10K 50/80 |

(Continued)

FOREIGN PATENT DOCUMENTS

| CN | 105093612 | 11/2015 |
| CN | 208607879 | 3/2019 |

(Continued)

OTHER PUBLICATIONS

PCT International Search Report (w/ English translation) and Written Opinion for corresponding Application No. PCT/CN2020/129408, mailed on Feb. 20, 2021, 5 pages.

*Primary Examiner* — Rockshana D Chowdhury
*Assistant Examiner* — Douglas R Burtner
(74) *Attorney, Agent, or Firm* — Dority & Manning, P.A.

(57) ABSTRACT

A display module includes a display panel, a backplane, a magnetic attraction structure and a plurality of bonding portions; the display panel has a light exit surface and a back surface opposite to the light exit surface; the backplane is disposed on a side of the display panel away from the light exit surface; the magnetic structure is disposed between the display panel and the backplane, and the magnetic structure is configured to attract and fix the display panel and the backplane; the plurality of bonding portions are disposed between the display panel and the backplane, and the plurality of bonding portions are spaced apart; the plurality of bonding portions are configured to bond the display panel and the backplane.

13 Claims, 7 Drawing Sheets

(58) Field of Classification Search
CPC ... H10K 30/80; H10K 99/00; H10K 2102/311
See application file for complete search history.

(56) References Cited

U.S. PATENT DOCUMENTS

| | | | | |
|---|---|---|---|---|
| 10,231,349 | B2* | 3/2019 | Kim | G06F 1/1656 |
| 10,943,890 | B2* | 3/2021 | Ryu | G09F 9/3026 |
| 11,353,732 | B2* | 6/2022 | Yoon | G09F 9/3026 |
| 11,925,049 | B2* | 3/2024 | Kim | H10K 50/84 |
| 2006/0207145 | A1 | 9/2006 | Kim et al. | |
| 2012/0068942 | A1* | 3/2012 | Lauder | H01F 7/0205 |
| | | | | 361/679.01 |
| 2014/0085907 | A1* | 3/2014 | Jun | H05K 5/03 |
| | | | | 362/362 |
| 2014/0118911 | A1* | 5/2014 | Tang | G02F 1/133308 |
| | | | | 361/679.01 |
| 2014/0184983 | A1 | 7/2014 | Wu et al. | |
| 2016/0330851 | A1 | 11/2016 | Huang et al. | |
| 2016/0359131 | A1* | 12/2016 | Gao | H10K 50/8426 |
| 2017/0094785 | A1 | 3/2017 | Sun et al. | |
| 2017/0118852 | A1* | 4/2017 | Kim | G06F 1/1656 |
| 2017/0141313 | A1* | 5/2017 | Min | H10K 71/00 |
| 2018/0101047 | A1 | 4/2018 | Li et al. | |
| 2018/0180929 | A1* | 6/2018 | Kim | G02F 1/133308 |
| 2018/0233695 | A1 | 8/2018 | Wang et al. | |
| 2019/0036068 | A1* | 1/2019 | Kim | G06F 1/1601 |
| 2019/0051827 | A1* | 2/2019 | Yu | H10K 50/84 |
| 2019/0327843 | A1* | 10/2019 | Chang | G02F 1/13336 |
| 2020/0043400 | A1* | 2/2020 | Chen | G09G 3/22 |
| 2020/0107128 | A1* | 4/2020 | Choi | H04R 7/045 |
| 2020/0194539 | A1* | 6/2020 | Kim | H10K 50/84 |
| 2020/0359120 | A1* | 11/2020 | Heo | H04R 3/00 |
| 2022/0157207 | A1* | 5/2022 | Yoon | H05K 1/14 |
| 2022/0210938 | A1* | 6/2022 | Kim | H05K 5/0017 |
| 2024/0036613 | A1* | 2/2024 | Onda | G06F 1/1656 |

FOREIGN PATENT DOCUMENTS

| | | |
|---|---|---|
| CN | 209342962 | 9/2019 |
| CN | 210467846 | 5/2020 |

* cited by examiner

DISPLAY MODULE HAVING MAGNETIC ATTRACTION STRUCTURE AND BONDING PORTIONS AND DISPLAY DEVICE

CROSS-REFERENCE TO RELATED APPLICATIONS

This application is a national phase entry under 35 USC 371 of International Patent Application No, PCT/CN2020/129408, filed on Nov. 17, 2020, which claims priority to Chinese Patent Application No. 201922054126.8, filed on Nov. 25, 2019, which are incorporated herein by reference in their entirety.

TECHNICAL FIELD

The present disclosure relates to the field of display technologies, and in particular, to a display module and a display device.

BACKGROUND

An organic light-emitting diode (OLED) display device is an extremely promising display technology. It has excellent display performance and is gradually replacing a liquid crystal display (LCD) to become the latest display technology, and has become a main force of a third generation of display device in the field of display technologies.

SUMMARY

In an aspect, a display module is provided. The display module includes a display panel, a backplane, a magnetic attraction structure and a plurality of bonding portions. The display panel has a light exit surface and a back surface opposite to the light exit surface. The backplane is disposed at a side of the display panel away from the light exit surface. The magnetic attraction structure is disposed between the display panel and the backplane, and is configured to attract and fix the display panel and the backplane. The plurality of bonding portions are disposed between the display panel and the backplane. The plurality of bonding portions are spaced apart, and are configured to bond the display panel and the backplane.

In some embodiments, the display module has a central region and an edge region surrounding the central region. The magnetic attraction structure includes at least one first magnetic attraction component and at least one second magnetic attraction component, the at least one first magnetic attraction component is disposed in the central region, and the at least one second magnetic attraction component is disposed in the edge region. A magnetic attraction force of the at least one first magnetic attraction component is less than a magnetic attraction force of the at least one second magnetic attraction component.

In some embodiments, the plurality of bonding portions are disposed in the edge region.

In some embodiments, the at least one first magnetic attraction component is made of a flexible material.

In some embodiments, each first magnetic attraction component is of a plate-shaped structure. The at least one first magnetic attraction component includes a plurality of first magnetic attraction components, and the plurality of first magnetic attraction components are arranged in an array.

In some embodiments, the at least one first magnetic attraction component is fixedly disposed on the backplane.

In some embodiments, the display module further includes a first bonding layer. The first bonding layer has two bonding surfaces, one of the two bonding surfaces is bonded to the backplane, and another of the two bonding surfaces is bonded to the at least one first magnetic attraction component.

In some embodiments, the at least one second magnetic attraction component includes a plurality of second magnetic attraction components that are spaced apart, and a material of the plurality of second magnetic attraction components includes metal.

In some embodiments, the edge region includes two first edge sub-regions disposed on two opposite sides of the central region in a first direction and two second edge sub-regions disposed on two opposite sides of the central region in a second direction. The first direction is a direction in which a side of the display panel extends, the second direction is a direction in which another side of the display panel extends, and the side and the another side are two adjacent sides of the display panel. The plurality of second magnetic attraction components are divided into a first group of magnetic attraction components and a second group of magnetic attraction components, and each of the first group of magnetic attraction components and the second group of magnetic attraction components includes second magnetic attraction components. The first group of magnetic attraction components is disposed in the two first edge sub-regions, and the second group of magnetic attraction components is disposed in the two second edge sub-regions.

In some embodiments, the backplane is a metal backplane. The first group of magnetic attraction components is fixedly disposed on the display panel, and the second group of magnetic attraction components is fixedly disposed on the backplane.

In some embodiments, the first group of magnetic attraction components and the second group of magnetic attraction components are both fixedly disposed on the backplane.

In some embodiments, the display module further includes two auxiliary magnetic attraction components, one of the two auxiliary magnetic attraction components being disposed in one second edge sub-region, and another of the two auxiliary magnetic attraction components being disposed in another second edge sub-region; and a second bonding layer having two bonding surfaces, one of the two bonding surfaces being bonded to the display panel, and another of the two bonding surfaces being bonded to the two auxiliary magnetic attraction components. Orthogonal projections, on the display panel, of all second magnetic attraction components in the second group of magnetic attraction components in each second edge sub-region, are within an orthogonal projection, on the display panel, of an auxiliary magnetic attraction component in the second edge sub-region. The auxiliary magnetic attraction component is configured to be magnetically attracted to all second magnetic attraction components in the second edge sub-region.

In some embodiments, the two auxiliary magnetic attraction components are both metal sheets.

In some embodiments, the plurality of bonding portions are located between the two auxiliary magnetic attraction components and the backplane.

In some embodiments, the display module further includes two auxiliary connection structures, one of the two auxiliary connection structures being disposed in one first edge sub-region, and another of the two auxiliary connection structures being disposed in another first edge sub-region; and a third bonding layer having two bonding surfaces, one of the two bonding surfaces being bonded to the display panel, and another of the two bonding surfaces being bonded to the two auxiliary connection structures. Orthogonal projections, on the display panel, of all second magnetic attraction components in the first group of magnetic attraction components in each first edge sub-region, are within an orthogonal projection, on the display panel, of an auxiliary connection structure in the first edge sub-region. The auxiliary connection structure is configured to be magnetically attracted to all second magnetic attraction components in the first edge sub-region.

In some embodiments, the backplane is a curved backplane. The first direction is parallel to a direction perpendicular to an uncurved side of the curved backplane.

In some embodiments, the backplane is provided with a plurality of through holes. Each bonding portion is disposed at an edge of a corresponding through hole close to the display panel.

In some embodiments; a material of the plurality of bonding portions includes a neutral transparent glass adhesive.

In some embodiments, the display module further includes an insulating sheet disposed on the backplane. The display panel has a placement region configured to provide a driving circuit board, and the placement region is located within an orthogonal projection of the insulating sheet on the display panel.

In another aspect, a display device is provided. The display device includes a housing and the display module as described in any of the above embodiments. The display module is disposed in the housing.

BRIEF DESCRIPTION OF THE DRAWINGS

In order to describe technical solutions in the present disclosure more clearly, the accompanying drawings to be used in the description of some embodiments of the present disclosure will be introduced briefly below. Obviously, the accompanying drawings to be described below are merely accompanying drawings of some embodiments of the present disclosure; and a person of ordinary skill in the art may obtain other drawings according to these drawings. In addition, the accompanying drawings in the following description can be regarded as schematic diagrams, and are not limitations on actual sizes of products and actual processes of methods involved in the embodiments of the present disclosure.

DETAILED DESCRIPTION

Figure 1A:
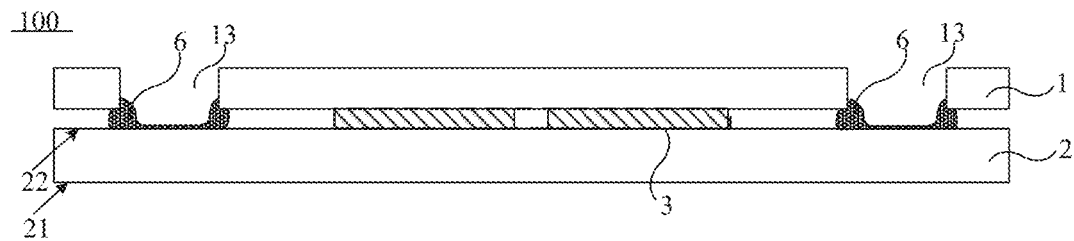
FIG. 1A is a sectional view of a display module, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive meaning, i.e., "including, but not limited to". In the description, the terms such as "one embodiment", "some embodiments", "exemplary embodiments"; "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and its derivatives may be used. For example, the term "connected" may be used in the description of some embodiments to indicate that two or more components are in direct physical or electrical contact with each other. However, the term "connected" may also mean that two or more components are not in direct contact with each other, but still cooperate or interact with each other. The embodiments disclosed herein are not necessarily limited to the contents herein.

The use of the phrase "configured to" herein means an open and inclusive expression, which does not exclude devices that are configured to perform additional tasks or steps.

Exemplary embodiments are described herein with reference to sectional views and/or plan views as idealized exemplary drawings. In the accompanying drawings, thicknesses of layers and sizes of regions are enlarged for clarity. Therefore, the exemplary embodiments should not be construed to be limited to the shapes of the regions shown herein, but to include deviations in the shapes due to, for example, manufacturing. In addition, the regions shown in the accompanying drawings are schematic in nature, and their shapes are not intended to show actual shapes of the regions in a device, and are not intended to limit the scope of the exemplary embodiments.

Figure 1B:
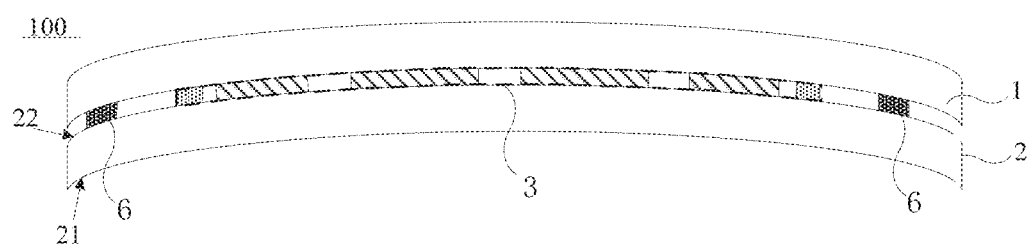
FIG. 1B is a sectional view of another display module, in accordance with some embodiments.

Some embodiments of the present disclosure provide a display module. As shown in FIGS. 1A and 1B, the display module 100 includes a backplane 1, a display panel 2, a magnetic attraction structure 3 and a plurality of bonding portions 6. The display panel 2 has a light exit surface 21 and a back surface 22 opposite to the light exit surface 21. The backplane 1 is disposed on a side of the display panel 2 away from the light exit surface 21. The magnetic attraction structure 3 is disposed between the display panel 2 and the backplane 1, and is configured to attract and fix the display panel 2 and the backplane 1. The plurality of bonding portions 6 are disposed between the display panel 2 and the backplane 1, and are spaced apart. The plurality of bonding portions 6 are configured to bond the display panel 2 to the backplane 1.

Figure 2A:
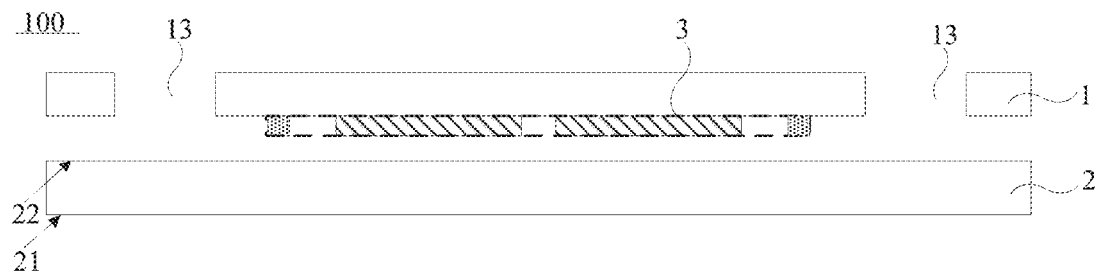
FIG. 2A is a diagram showing an assembly process of a display module, in accordance with some embodiments.

When the display module 100 is assembled, as shown in FIGS. 2A and 28, the back surface 22 of the display panel 2 and the backplane 1 are attracted and fixed through the magnetic attraction structure 3, so as to achieve alignment pre-assembly. Since the display panel 2 and the backplane 1 are attracted and fixed through the magnetic attraction structure 3, relative positions of the display panel 2 and the backplane 1 may be easily adjusted during the alignment pre-assembly, which reduces an assembly difficulty and improves an assembly accuracy. After the display panel 2 and the backplane 1 are fixed to each other and accurately aligned, the display panel 2 and the backplane 1 are further fixed by using the plurality of bonding portions 6. Due to magnetic attraction force of the magnetic attraction structure 3 in a thickness direction of the display module 100, the display panel 2 and the backplane 1 are attracted and fixed through the magnetic attraction structure 3. Due to bonding force of the bonding portions 6 to the display panel 2 and the backplane 1, the display panel 2 and the backplane 1 are bonded through the bonding portions 6. In this way, the display panel 2 and the backplane 1 do not move relative to each other in a direction perpendicular to the thickness direction of the display module 100. Here, the thickness direction of the display module 100 is parallel to a direction pointing from the light exit surface 21 of the display panel 2 to the back surface 22 thereof, and a direction pointing from the back surface 22 to the light exit surface 21.

In some embodiments, the display panel 2 is a flexible display panel. In some examples, the display panel 2 is a flexible self-luminous display panel. For example, the display panel 2 is a flexible OLED display panel.

In some embodiments, the backplane 1 is a metal backplane. In some examples, a material of the backplane 1 includes one of an iron (Fe) element, a cobalt (Go) element, a nickel (Ni) element and an alloy thereof, a rare earth element and an alloy thereof, or a compound of manganese (Mn).

Figure 2B:
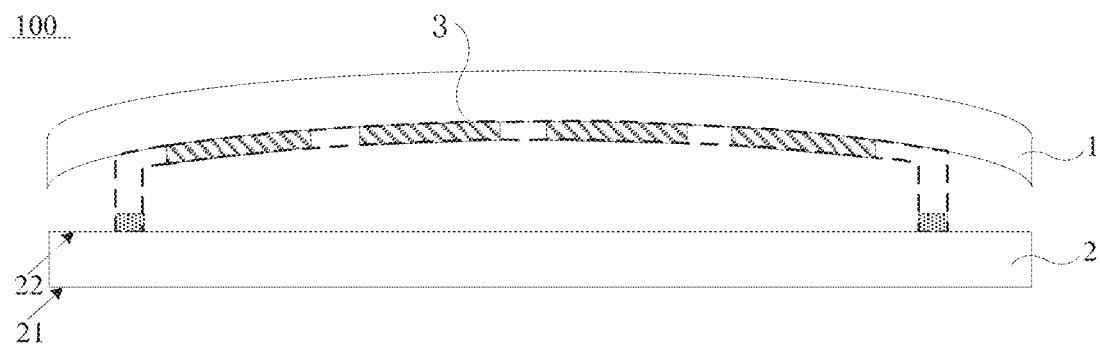
FIG. 2B is a diagram showing an assembly process of another display module, in accordance with some embodiments.

The display module 100 may be a flat display module or a curved display module, which is not limited in the embodiments of the present disclosure. As shown in FIG. 2A, before the flat display module is assembled, the backplane 1 is a flat backplane, and the display panel 2 is a flat display panel. As shown in FIG. 2B, before the curved display module is assembled, the backplane 1 is a curved backplane, and the display panel 2 is a flexible flat display panel. During the assembly of the curved display module, the magnetic attraction force generated by the magnetic attraction structure 3 and the bonding force of the bonding portions 6 to the display panel 2 and the backplane 1 cause the flat display panel to bend according to a curvature of the backplane 1 to obtain the curved display module.

In the display module 100 provided in the embodiments of the present disclosure, the display panel 2 and the backplane 1 are fixed through the plurality of bonding portions 6 disposed therebetween and the magnetic attraction structure 3 disposed therebetween. In this way, it may be possible to ensure that the display panel 2 and the backplane 1 are firmly fixed together; and relative to that the display panel 2 and the backplane 1 are fixed through an entire bonding layer, which may cause an excessively large stress of the display panel 2 and further cause breakage of the display panel 2, this problem may be avoided in the embodiments of the present disclosure through cooperation of the magnetic attraction structure 3 and the plurality of bonding portions 6. In addition, since the magnetic attraction force generated by the magnetic attraction structure 3 between the display panel 2 and the backplane 1 is mainly distributed in a normal direction (i.e., a thickness direction of the display panel 2), and the magnetic attraction force is weak in a tangential direction (i.e., a direction perpendicular to the thickness direction of the display panel 2), during transportation of the display module, vibration on the display panel 2 and the backplate 1 may be absorbed through slight deformations, in the tangential direction, of portions of the display panel 2 and the backplane 1 in a region where the magnetic attraction structure 3 is located, thereby avoiding damage to the display panel 2.

Figure 3:
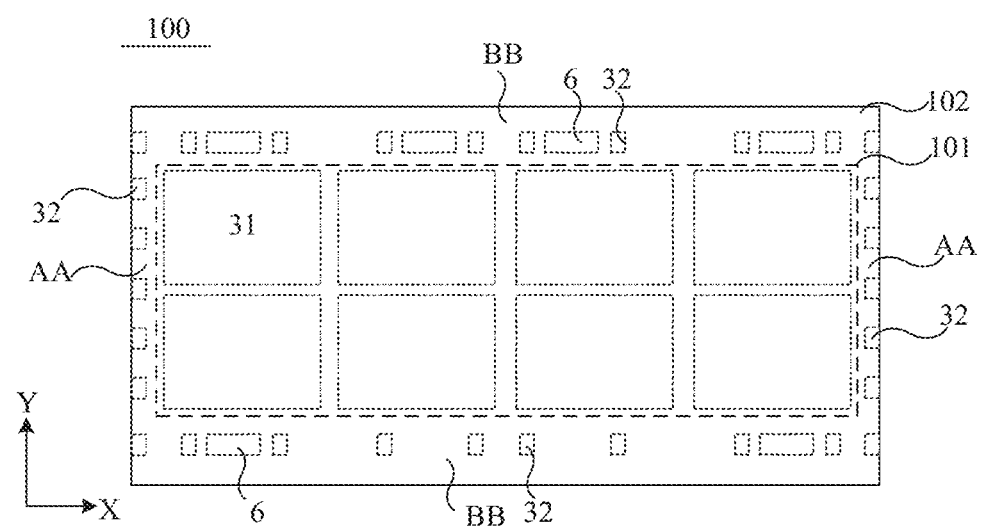
FIG. 3 is a top view of a display module, in accordance with some embodiments.
Figure 4A:
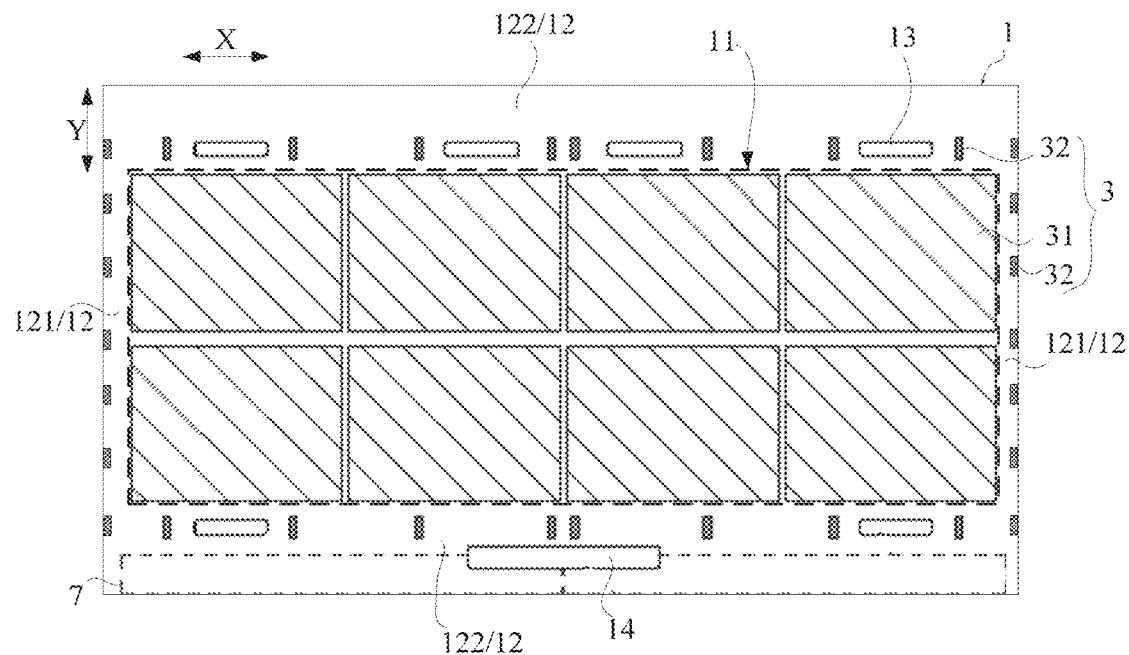
FIG. 4A is a front view of a backplane, in accordance with some embodiments.
Figure 4B:
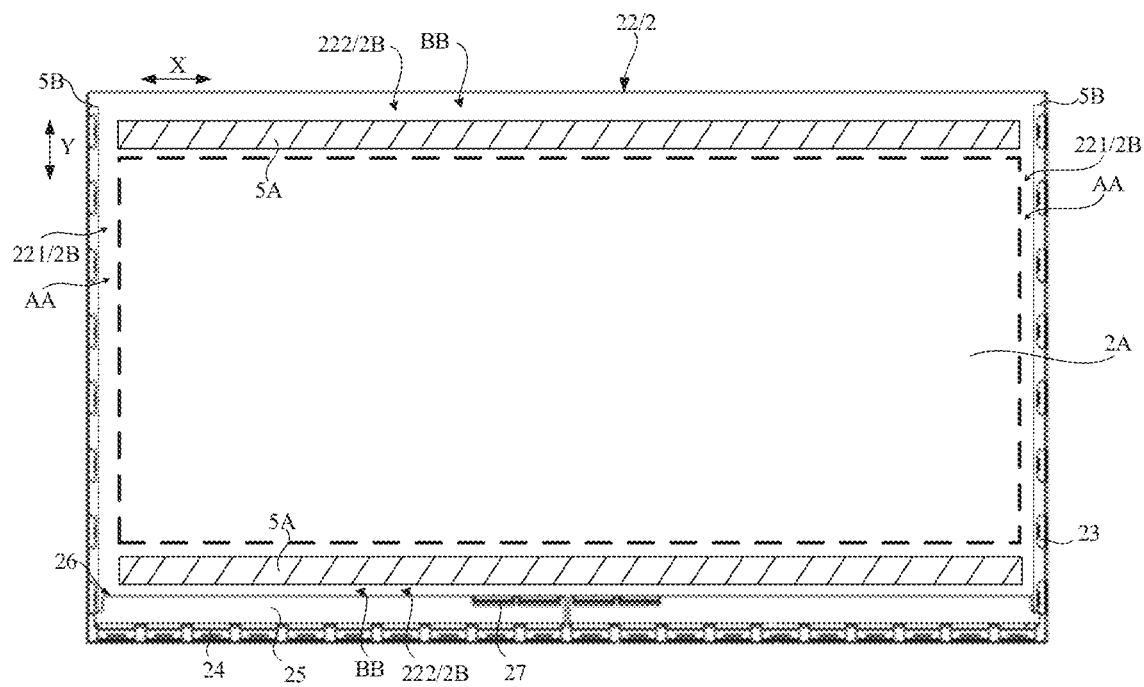
FIG. 4B is a rear view of a display panel, in accordance with some embodiments.
Figure 4C:
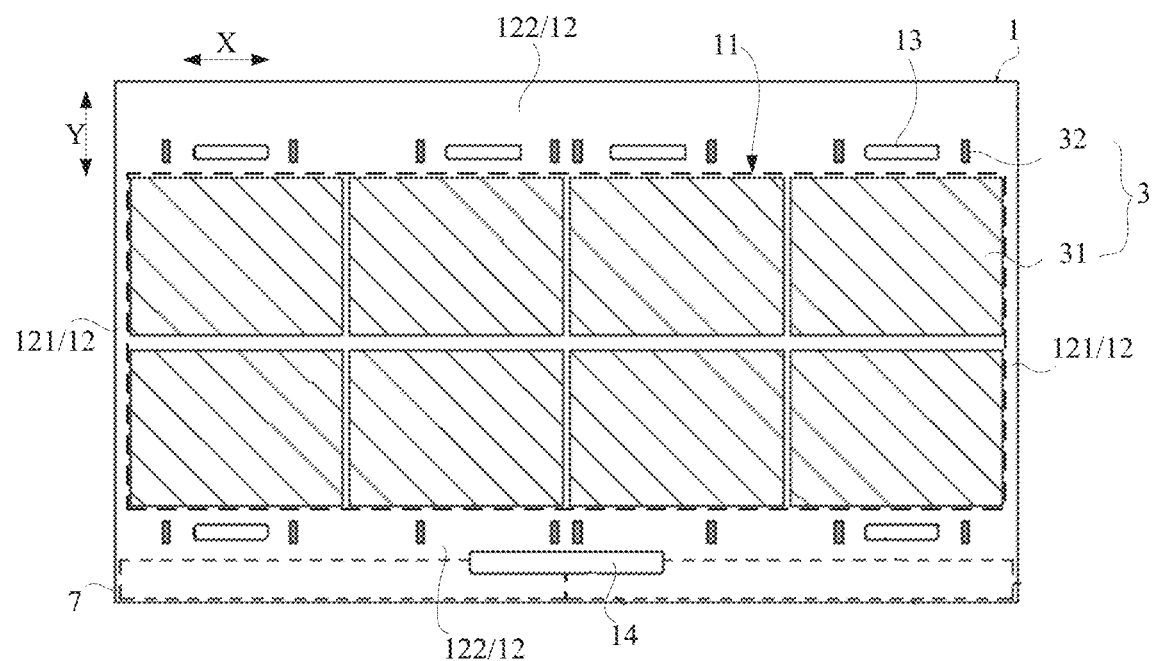
FIG. 4C is a front view of another backplane, in accordance with some embodiments.
Figure 4D:
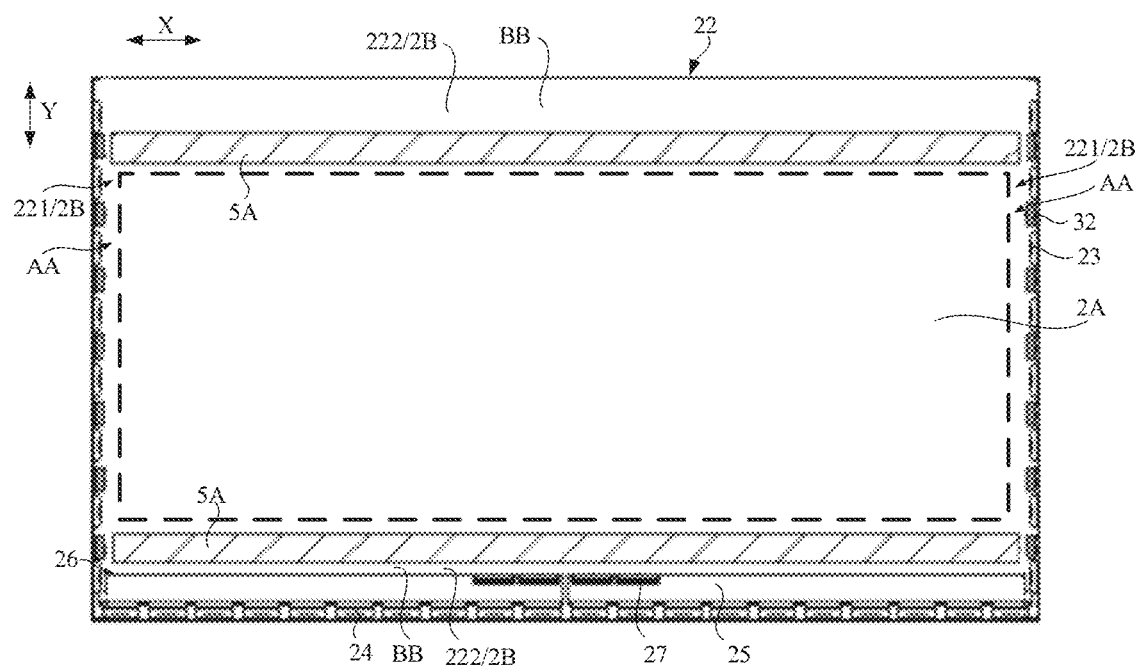
FIG. 4D is a rear view of another display panel; in accordance with some embodiments.

In some embodiments, as shown in FIG. 3, the display module 100 has a central region 101 and an edge region 102 surrounding the central region 101. Correspondingly, as shown in FIGS. 4A and 4C, the backplane 1 has a backplane central region 11 and a backplane edge region 12, and the backplane edge region 12 surrounds the backplane central region 11. An orthogonal projection of the backplane central region 11 on a plane perpendicular to the thickness direction of the display module 100 completely overlaps with an orthogonal projection of the central region 101 on the plane. An orthogonal projection of the backplane edge region 12 on the plane completely overlaps with an orthogonal projection of the edge region 102 on the plane. Similarly, as shown in FIGS. 4B and 4D, the display panel 2 has a panel central region 2A and a panel edge region 2B, and the panel edge region 2B surrounds the panel central region 2A. An orthogonal projection of the panel central region 2A on the plane completely overlaps with the orthogonal projection of the central region 101 on the plane. An orthogonal projection of the panel edge region 2B on the plane completely overlaps with the orthogonal projection of the edge region 102 on the plane. That is to say, in the display module 100, the panel central region 2A is aligned with the backplane central region 11, and the panel edge region 2B is aligned with the backplane edge region 12.

In some examples, the central region 101 is a display region of the display module 100, and the edge region 102 is a peripheral region of the display module 100. In some other examples, an area of the central region 101 is slightly less than an area of the display region of the display module 100, and the edge region 102 is another region of the display module 100.

In some embodiments, as shown in FIG. 3, the magnetic attraction structure 3 include at least one first magnetic attraction component 31 and at least one second magnetic attraction component 32. The at least one first magnetic attraction component 31 is disposed in the central region 101, the at least one second magnetic attraction component 32 is disposed in the edge region 102, and a magnetic attraction force of the at least one first magnetic attraction component 31 is less than a magnetic attraction force of the at least one second magnetic attraction component 32. The first magnetic attraction component 31 generates the magnetic attraction force in the central region 101, so that a portion of the display panel 2 in the panel central region 2A and a portion of the backplane 1 in the backplane central region 11 are attracted and fixed. The second magnetic attraction component 32 generates the magnetic attraction force in the edge region 102, so that a portion of the display panel 2 in the panel edge region 2B and a portion of the backplane 1 in the backplane edge region 12 are attracted and fixed.

Since the magnetic attraction force of the first magnetic attraction component 31 is less than the magnetic attraction force of the second magnetic attraction component 32, a stress of the portion of the display panel 2 in the panel central region 2A is reduced in a case of ensuring that the display panel 2 and the backplane 1 are accurately aligned and firmly fixed in the edge region 102. Especially during the assembly of the curved display module, through the arrangement of the first magnetic attraction component 31 and the second magnetic attraction component 32, a large magnetic attraction force acts on the edge region 102, so that the display panel 2 achieves a predetermined overall curvature; a small magnetic attraction force acts on the central region 101, so that the display panel 2 is well attached to the curved backplane in the central region 101, and in turn, a predetermined local curvature is achieved, and a bending transition is smooth. As a result, the display panel 2 is able to well bend to be attached to the curved backplane, and concentration of the stress and excessive bending of the portion of the display panel 2 in the panel central region 2A are avoided, and it may be possible to ensure that the display panel 2 is not damaged during the assembly.

In some embodiments, as shown in FIG. 3, the plurality of bonding portions 6 are disposed in the edge region 102. Due to the bonding force of the bonding portions 6 between the panel edge region 2B and the backplane edge region 12, the display panel 2 and the backplane 1 may be well bonded, and the display panel 2 and the backplane 1 may be prevented from being warped and separated in the edge region 102. In addition, a stress of a portion of the display module 100 in the central region 101 may be reduced, thereby ensuring safety of structures in the central region 101.

In some examples, the first magnetic attraction component 31 is a soft magnetic sheet, the soft magnetic sheet is in a shape of a plate and has weak magnetism. In a case where a flat surface of the soft magnetic sheet is completely attached, a slight magnetic attraction force may be generated, which plays a role of auxiliary fixation. For example, a material of the soft magnetic sheet includes rubber.

A flexible material is soft in property and has a good buffer effect. Therefore, the first magnetic attraction component 31 made of the flexible material may prevent impact on the display panel 2. In the curved display module assembled from the flat display panel 2 and the curved backplane, the first magnetic attraction component 31 made of the flexible material further has advantages of being easy to bend and being more attached to the curved backplane.

A shape of the first magnetic attraction component 31 is determined according to actual needs. In some examples, each first magnetic attraction component 31 is of a plate-shaped structure. A size of the first magnetic attraction component 31 with the plate-shaped structure is large, so that an action range of the magnetic attraction force generated by the first magnetic attraction component 31 is large, and the magnetic attraction force is uniformly distributed.

In some examples, there are a plurality of first magnetic attraction components 31, which are arranged in an array in the central region 101. For example, the plurality of first magnetic attraction components 31 are uniformly arranged in the central region 101, and are distributed in rows and columns.

Through the plurality of first magnetic attraction components 31, an attraction area of the panel central region 2A and the backplane central region 11 may be increased. Therefore, it may be possible to ensure that the display panel 2 and the backplane 1 are attracted and fixed, and the stress of the display panel 2 and the backplane 1 may be reduced.

The first magnetic attraction component(s) 31 may be disposed on the back surface 22 of the display panel 2 or on a surface of the backplane 1 facing the display panel 2. In some examples, as shown in FIGS. 4A and 40, the first magnetic attraction component(s) 31 are fixedly disposed on the backplane 1. That is, before the display panel 2 and the backplane 1 are pre-assembled, the first magnetic attraction component(s) 31 have been fixed on the backplane 1. When the display panel 2 and the backplane 1 are pre-assembled, the first magnetic attraction component(s) 31 are magnetically attracted to the display panel 2.

Figure 6:
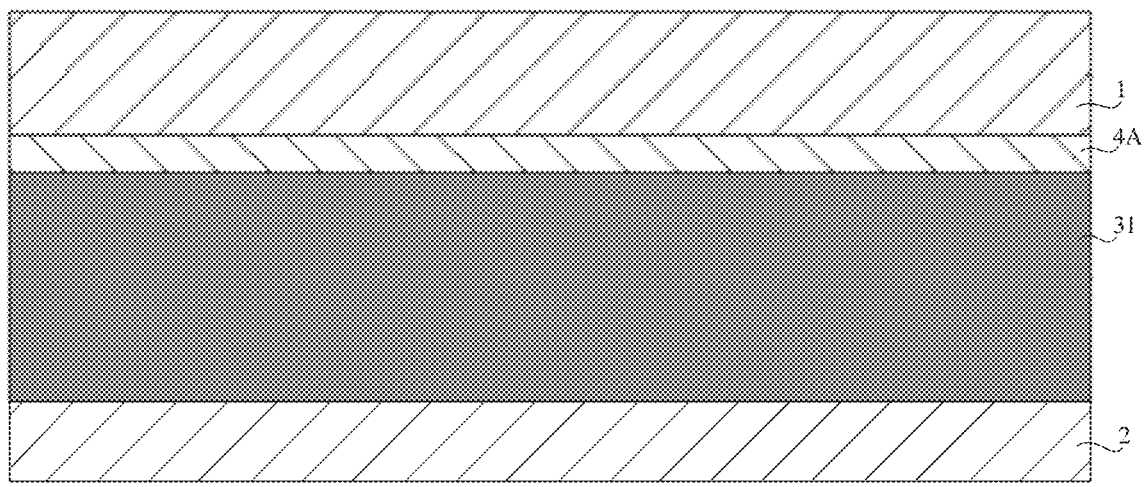
FIG. 6 is a sectional view of yet another display module; in accordance with some embodiments.

As shown in FIG. 6, in some examples, the display module 100 further includes a first bonding layer 4A. The first bonding layer 4A has two bonding surfaces, one of which is bonded to the backplane 1, and the other of which is bonded to the at least one first magnetic attraction component 31, so that the first magnetic attraction component(s) 31 are fixed on the backplane 1.

For example, the at least one first magnetic attraction component 31 includes the plurality of first magnetic attraction components 31, and the first bonding layer 4A includes a plurality of bonding blocks. A surface of each bonding block is bonded to the backplane 1, and another surface of the bonding block is bonded to a corresponding first magnetic attraction component 31.

For example, the first bonding layer 4A may be a double-sided tape.

In the embodiments, in order to ensure that the first magnetic attraction component 31 is bonded to the backplane 1, a bonding force between the first bonding layer 4A and the backplane 1 may be greater than a magnetic attraction force between the first magnetic attraction component 31 and the display panel 2. In this way, it may be possible to prevent the first magnetic attraction component 31 and the backplane 1 from being separated.

In some embodiments, the at least one second magnetic attraction component 32 includes a plurality of second magnetic attraction components 32 that are spaced apart, and a material of the plurality of second magnetic attraction components 32 includes metal. Each second magnetic attraction component 32 generates a magnetic attraction force acting on the panel edge region 2B and the backplane edge region 12, so that the display panel 2 and the backplane 1 are attracted in the edge region 102 through magnetic attraction forces generated by the plurality of second magnetic attraction components 32. In this way, it may prevent stress of a portion of the display module 100 in the edge region 102 from being concentrated; and the display panel 2 and the backplane 1 may be attracted and fixed at multiple positions, and may be more tightly connected.

For example, the material of the second magnetic attraction component 32 includes one of the iron (Fe) element, the cobalt (Co) element, the nickel (Ni) element and the alloy thereof, the rare earth element and the alloy thereof; or the compound of manganese (Mn). For example, the second magnetic attraction component 32 is a neodymium iron boron magnet.

As shown in FIG. 3, in some embodiments; the edge region 102 includes two first edge sub-regions AA disposed on two opposite sides of the central region 101 in a first direction X, and two second edge sub-regions BB disposed on two opposite sides of the central region 101 in a second direction Y. The first direction X is a direction in which a side of the display panel 2 extends, the second direction Y is a direction in which another side of the display panel 2 extends, and the side and the another side are two adjacent sides of the display panel 2. For example, the first direction X is a direction in which a long side of the display panel 2 extends, and the second direction Y is a direction in which a short side of the display panel 2 extends. For another example, in the curved display module assembled from the flat display panel and the curved backplane, the first direction X is parallel to a direction perpendicular to an uncurved side of the curved backplane.

The plurality of second magnetic attraction components 32 are divided into a first group of magnetic attraction components and a second group of magnetic attraction components. The first group of magnetic attraction components includes second magnetic attraction components 32, and the second group of magnetic attraction components includes second magnetic attraction components 32. The first group of magnetic attraction components is disposed in the two first edge sub-regions AA. That is, a part of the second magnetic attraction components 32 in the first group of magnetic attraction components are disposed in one first edge sub-region AA, and a remaining part of the second magnetic attraction components 32 are disposed in the other first edge sub-region AA. The second group of magnetic attraction components is disposed in the two second edge sub-regions BB. That is, a part of the second magnetic attraction components 32 in the second group of magnetic attraction components are disposed in one second edge sub-region BB, and a remaining part of the second magnetic attraction components 32 are disposed in the other second edge sub-region BB.

Based on this, magnetic attraction forces generated by the plurality of second magnetic attraction components 32 in the two first edge sub-regions AA and the two second edge sub-regions BB are uniformly distributed. Therefore, the display panel 2 and the backplane 1 may be well attracted and fixed in the entire edge region 102, thereby preventing local separating or warping of the display module 100.

In some examples, the first group of magnetic attraction components and the second group of magnetic attraction components are both fixedly disposed on the display panel 2. That is, each second magnetic attraction component 32 in the first group of magnetic attraction components is fixed on the display panel 2, and is magnetically attracted to the backplane 1; each second magnetic attraction component 32 in the second group of magnetic attraction components is fixed on the display panel 2, and is magnetically attracted to the backplane 1. In this way, the first group of magnetic attraction components and the second group of magnetic attraction components that are disposed on the display panel 2 may be directly magnetically attracted to the backplane 1.

In some other examples, as shown in FIGS. 4A and 4B, the first group of magnetic attraction components and the second group of magnetic attraction components are both fixedly disposed on the backplane 1. That is, each second magnetic attraction component 32 in the first group of magnetic attraction components is fixed on the backplane 1, and is magnetically attracted to the display panel 2; each second magnetic attraction component 32 in the second group of magnetic attraction components is fixed on the backplane 1, and is magnetically attracted to the display panel 2. The first group of magnetic attraction components and the second group of magnetic attraction components that are disposed on the backplane 1 may be magnetically attracted to metal layer(s) in the display panel 2.

In yet some other examples, as shown in FIGS. 4C and 4D, the first group of magnetic attraction components are fixedly disposed on the display panel 2, and the second group of magnetic attraction components are fixedly disposed on the backplane 1. That is, each second magnetic attraction component 32 in the first group of magnetic attraction components is fixed on the display panel 2, and is magnetically attracted to the backplane 1; each second magnetic attraction component 32 in the second group of magnetic attraction components is fixed on the backplane 1, and is magnetically attracted to the display panel 2. In a case where the backplane 1 is the metal backplane, the first group of magnetic attraction components disposed on the display panel 2 may be directly magnetically attracted to the metal backplane. The second group of magnetic attraction components disposed on the backplane 1 may be magnetically attracted to the metal layer(s) in the display panel 2.

For example, as shown in FIGS. 4A and 4C, corresponding to the two first edge sub-regions AA and the two second edge sub-regions BB, the backplane edge region 12 is also divided into two first backplane edge sub-regions 121 disposed on two opposite sides of the backplane central region 11 in the first direction X, and two second backplane edge sub-regions 122 disposed on two opposite sides of the central region 101 in the second direction Y. An orthogonal projection of each first backplane edge sub-region 121 on the plane perpendicular to the thickness direction of the display module 100 completely overlaps with an orthogonal projection of a corresponding first edge sub-region AA on the plane. An orthogonal projection of each second backplane edge sub-region 122 on the plane completely overlaps with an orthogonal projection of a corresponding second edge sub-region BB on the plane. The second magnetic attraction components 32 included in the second group of magnetic attraction components are disposed on the backplane 1 and located on the two second backplane edge sub-regions 122.

As shown in FIGS. 4B and 4O, corresponding to the two first edge sub-regions AA and the two second edge sub-regions BB, the panel edge region 2B is also divided into two first panel edge sub-regions 221 disposed on two opposite sides of the panel central region 2A in the first direction X, and two second panel edge sub-regions 222 disposed on two opposite sides of the panel central region 2A in the second direction Y. An orthogonal projection of each first panel edge sub-region 221 on the plane perpendicular to the thickness direction of the display module 100 completely overlaps with an orthogonal projection of a corresponding first edge sub-region AA on the plane. An orthogonal projection of each second panel edge sub-region 222 on the plane completely overlaps with an orthogonal projection of a corresponding second edge sub-region BB on the plane. As shown in FIG. 4D, the second magnetic attraction components 32 included in the first group of magnetic attraction components are disposed on the display panel 2 and located on the two first panel edge sub-regions 221.

Figure 7:
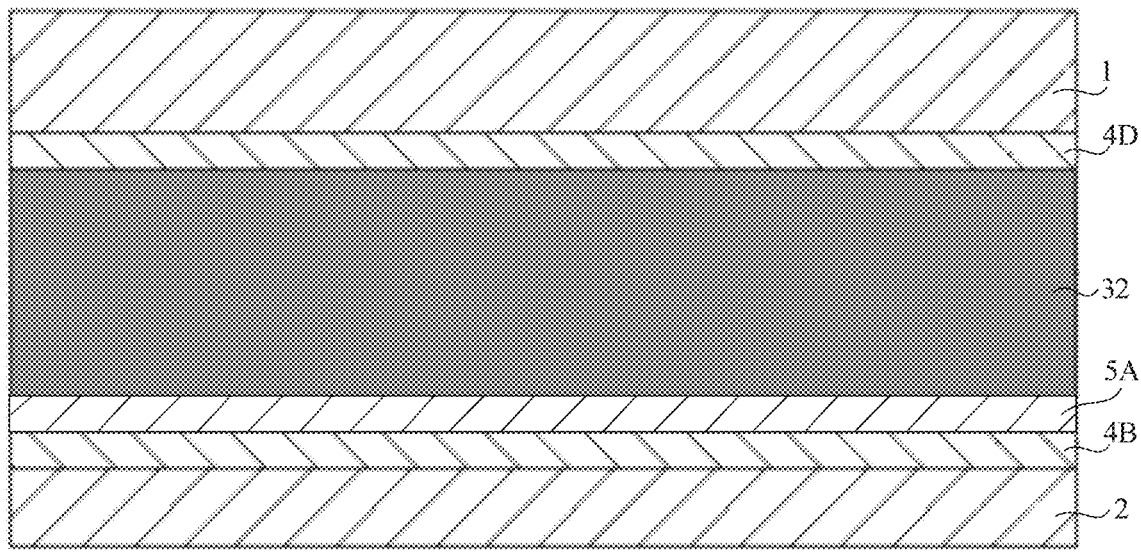
FIG. 7 is a sectional view of yet another display module, in accordance with some embodiments.
Figure 8:
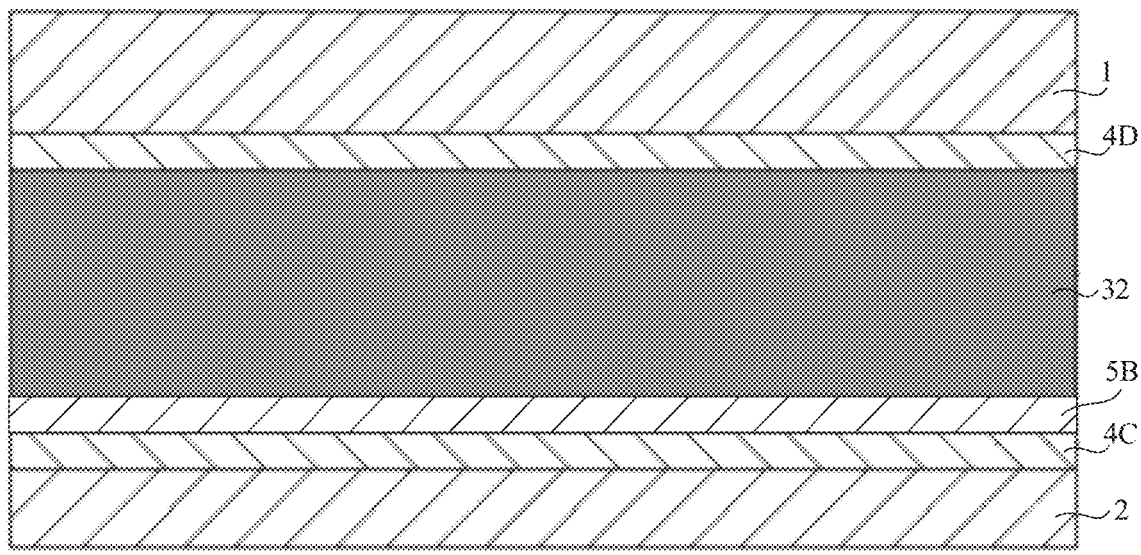
FIG. 8 is a sectional view of yet another display module, in accordance with some embodiments.

As shown in FIGS. 7 and 8, in some examples, the display module further includes a fourth bonding layer 4D. The fourth bonding layer 4D has two bonding surfaces, one of which is bonded to the backplane 1, and the other of which is bonded to the second magnetic attraction components 32, so that the second magnetic attraction components 32 are fixed on the backplane 1. For example, the fourth bonding layer 4D is a double-sided tape.

A bonding force between the fourth bonding layer 4D and the backplane 1 is greater than a magnetic attraction force between the second magnetic attraction component 32 disposed on the backplane 1 and the display panel 2. Therefore, it is possible to prevent the second magnetic attraction component 32 from being separated from the backplane 1, thereby ensuring reliability of the connection between the display panel 2 and the backplane 1.

As shown in FIGS. 4B, 4D and 7, in some embodiments, the display module 100 further includes two auxiliary magnetic attraction components 5A and a second bonding layer 4B, The second bonding layer 4B has two bonding surfaces, one of which is bonded to the display panel 2, and the other of which is bonded to the two auxiliary magnetic attraction components 5A, so that the auxiliary magnetic attraction components 5A are fixed on the display panel 2. It will be noted that, FIG. 7 only shows that the other bonding surface of the second bonding layer 4B is bonded to one auxiliary magnetic attraction component 5A. An arrangement of the other auxiliary magnetic attraction component 5A is the same as an arrangement of the one auxiliary magnetic attraction component 5A shown in FIG. 7. In addition, since the two auxiliary magnetic attraction components 5A are disposed on two opposite sides of the central region 101, the second bonding layer 4B may be disposed only in a region where the two auxiliary magnetic attraction components 5A are located.

In the two auxiliary magnetic attraction components 5A, one auxiliary magnetic attraction component 5A is disposed in one second edge sub-region BB (that is, as shown in FIGS. 4B and 4D, the one auxiliary magnetic attraction component 5A is disposed on the display panel 2 and located on a second panel edge sub-region 222 corresponding to the one second edge sub-region BB), and the other auxiliary magnetic attraction component 5A is disposed in the other second edge sub-region BB (that is, as shown in FIGS. 4B and 4D, the other auxiliary magnetic attraction component 5A is disposed on the display panel 2 and located on the other second panel edge sub-region 222 corresponding to the other second edge sub-region BB).

Orthogonal projections, on the display panel 2, of all second magnetic attraction components 32 in the second group of magnetic attraction components located in each second edge sub-region BB are within an orthogonal projection, on the display panel 2, of the auxiliary magnetic attraction component 5A in the second edge sub-region BB. The auxiliary magnetic attraction component 5A is configured to be magnetically attracted to all second magnetic attraction components 32 in the second group of magnetic attraction components. That is, all second magnetic attraction components 32 in each second edge sub-region BB are magnetically attracted to the auxiliary magnetic attraction component 5A.

A bonding force generated by the second bonding layer 4B between the auxiliary magnetic attraction component 5A and the display panel 2 is greater than a magnetic attraction force between the auxiliary magnetic attraction component 5A and the second magnetic attraction components 32. Therefore, it is possible to prevent the auxiliary magnetic attraction component 5A and the display panel 2 from being separated, thereby ensuring reliability of connection between the display panel 2 and the auxiliary magnetic attraction component 5A.

For example, the second bonding layer 4B may be a double-sided tape.

For example, the auxiliary magnetic attraction component 5A is a metal sheet. For example, a thickness of the metal sheet is approximately in a range of 0.25 mm to 0.35 mm, such as 0.25 mm, 0.28 mm, 0.3 mm, 0.32 mm or 0.35 mm. A thickness direction of the metal sheet is parallel to the thickness direction of the display module 100.

Considering that a thickness of the metal layer in the display panel 2 is usually less than 0.1 mm, and a magnetic attraction force between the metal layer and the second magnetic attraction component 32 is small, by providing the auxiliary magnetic attraction components 5A, a magnetic attraction force between the second magnetic attraction component 32 in the second group of magnetic attraction components and both the auxiliary magnetic attraction component 5A and the metal layer in the display panel 2 is stronger. Therefore, the magnetic attraction force between the display panel 2 and the backplane 1 is increased, and the fixing between the display panel 2 and the backplane 1 is more firm. In addition, by reasonably setting the thickness of the auxiliary magnetic attraction component 5A, influence on the thickness of the display module 100 may be neglected, and for the curved display module, the bending of the display panel 2 is not affected.

Figure 9:
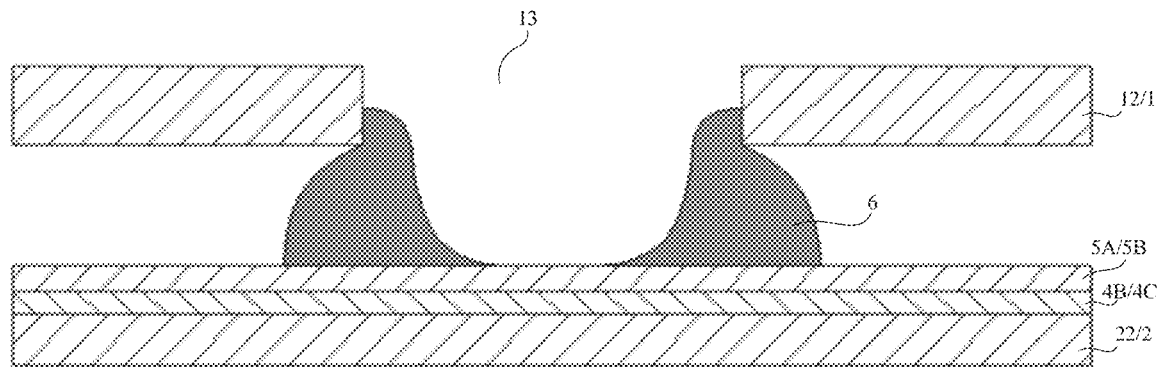
FIG. 9 is a sectional view of yet another display module; in accordance with some embodiments.

In some examples, as shown in FIG. 9, the plurality of bonding portions 6 are located between the two auxiliary magnetic attraction components 5A and the backplane 1. In this case, the bonding portions 6 do not directly contact the display panel 2. As a result, it may be possible to avoid damage to the structure of the display panel 2. In addition, when the display panel 2 and the backplane 1 need to be separated, the bonding portions 6 may be directly cut without damaging the display panel 2, and thus the disassembly is safe and convenient.

In some embodiments, as shown in FIG. 4A, in the case where the first group of magnetic attraction components and the second group of magnetic attraction components are both disposed on the backplane 1, as shown in FIGS. 4B and 8, the display module further includes two auxiliary connection structures 5B and a third bonding layer 40. The third bonding layer 4C has two bonding surfaces, one of which is bonded to the display panel 2, and the other of which is bonded to the two auxiliary connection structures 5B, so that the auxiliary connection structures 5B and the display panel 2 are firmly fixed. It will be noted that, FIG. 8 only shows that the other bonding surface of the third bonding layer 4C is bonded to one auxiliary connection structure 5B. An arrangement of the other auxiliary connection structure 5B is the same as an arrangement of the one auxiliary connection structure 5B shown in FIG. 8. In addition, since the two auxiliary connection structures 5B are disposed on two opposite sides of the central region 101, the third bonding layer 4C may be disposed only in a region where the two auxiliary connection structures 5B are located.

In the two auxiliary connection structures 5B, one auxiliary connection structure 5B is disposed in a first edge sub-region AA (that is, as shown in FIG. 4B, the auxiliary connection structure 5B is disposed on the display panel 2 and located on a first panel edge sub-region 221 corresponding to the first edge sub-region AA), and the other auxiliary connection structure 5B is disposed in the other first edge sub-region AA (that is, as shown in FIG. 4B, the other auxiliary connection structure 5B is disposed on the display panel 2 and located on the other first panel edge sub-region 221 corresponding to the other first edge sub-region AA).

Orthogonal projections, on the backplane 1, of all second magnetic attraction components 32 in each first edge sub-region AA in the first group of magnetic attraction components are within an orthogonal projection, on the backplane 1, of the auxiliary connection structure 5B in the first edge sub-region AA. The auxiliary connection structure 5B is configured to be magnetically attracted to all second magnetic attraction components 32 in the first edge sub-region AA. That is, all second magnetic attraction components 32 in each first edge sub-region AA are magnetically adsorbed to the auxiliary connection structure 5B.

A bonding force generated by the third bonding layer 4C between the auxiliary connection structure 5B and the display panel 2 is greater than a magnetic attraction force between the auxiliary connection structure 5B and the second magnetic attraction component 32. Therefore, it is possible to prevent the auxiliary connection structure 5B and the display panel 2 from being separated, thereby ensuring reliability of connection between the display panel 2 and the auxiliary connection structure 5B.

For example, the third bonding layer 4C may be a double-sided tape.

For example, the auxiliary connection structure 5B is a metal sheet. For example, a thickness of the metal sheet is approximately in a range of 0.25 mm to 0.35 mm, such as 0.25 mm, 0.28 mm, 0.3 mm, 0.32 mm, or 0.35 mm. A thickness direction of the metal sheet is parallel to a thickness direction of the backplane 1.

Considering that the thickness of the metal layer in the display panel 2 is usually less than 0.1 mm, and a magnetic attraction force between the metal layer and the second magnetic attraction component 32 is small, by providing the auxiliary connection structures 5B, a magnetic attraction force between the second magnetic attraction component 32 in the first group of magnetic attraction components and both the auxiliary connection structure 5B and the metal layer in the display panel 2 is stronger. Therefore, the magnetic attraction force between the display panel 2 and the backplane 1 is increased, and the fixing between the display panel 2 and the backplane 1 is more firm. In addition, by reasonably setting the thickness of the auxiliary connection structure 5B, influence on the thickness of the display module 100 may be neglected, and for the curved display module, the bending of the display panel 2 is not affected.

In some examples, a part of the plurality of bonding portions 6 are located between the two auxiliary magnetic attraction components 5A and the backplane 1, and a remaining part of the plurality of bonding portions 6 are located between the two auxiliary connection structures 5B and the backplane 1. Therefore, the bonding portions 6 do not directly contact the display panel 2. As a result, it may be possible to avoid the damage to the structure of the display panel 2. In addition, when the display panel 2 and the backplane 1 need to be separated, the bonding portions 6 may be directly cut without damaging the display panel 2, and thus the disassembly is safe and convenient.

In some examples, as shown in FIGS. 4B and 4D, the display panel 2 further includes at least one first connection circuit board 23 bonded to at least one first panel edge sub-region 221.

On this basis, in a case where second magnetic attraction components 32 are disposed on the display panel 2 and located on the first panel edge sub-region(s) 221, as shown in FIG. 4D, in the second direction Y, second magnetic attraction component(s) 32 and first connection circuit board(s) 23 that are located on the same first panel edge sub-region 221 are staggered. The auxiliary connection structure(s) 5B and the first connection circuit board(s) 23 are staggered, and thus they do not contact with each other, which can avoid a short circuit.

For example, the first connecting circuit board 23 includes a flexible circuit board and gate driver integrated circuit(s) (IC(s)) disposed on the flexible circuit board. For another example, the first connecting circuit board 23 includes a thin film and gate driver IC(s) disposed on the thin film.

As shown in FIGS. 1A, 2A and 9, in some embodiments, the backplane 1 is provided with a plurality of through holes 13, and each bonding portion 6 is disposed at an edge of a corresponding through hole 13 close to the display panel 2. After the display panel 2 and the backplane 1 are pre-assembled through the magnetic attraction structure 3, by performing a dispensing process, the bonding portions 6 are provided at edges of the through holes 13 close to the display panel 2.

In some examples, as shown in FIGS. 4A and 4C, a part of the plurality of through holes 13 are disposed in one second backplane edge sub-region 122, and are spaced apart in the first direction X; a remaining part of the plurality of through holes 13 are disposed in the other second backplane edge sub-region 122, and are spaced apart in the first direction X. In this way, when the backplane 1 is bent, a stress generated due to the bending of the backplane 1 may be released through the through holes 13 arranged in the first direction X, thereby avoiding an excessively large stress of the backplane 1.

In some embodiments, a material of the plurality of bonding portions 6 includes a neutral transparent glass adhesive. The neutral transparent glass adhesive is in a semi-liquid and semi-solid state after being applied to edges of the through holes 13, and it needs to take a period of time to solidify. Therefore, there is certain fault tolerance for coating of the neutral transparent glass adhesive, and a coating position may be adjusted before the glass adhesive is solidified. After the neutral transparent glass adhesive is solidified into the bonding portions 6, the bonding portions 6 have strong viscosity and certain elasticity, which facilitates the fixing between the display panel 2 and the backplane 1. In addition, when the display panel 2 needs to be detached from the backplane 1, the bonding portions 6 may be heated to soften them, and then the bonding portions 6 is peeled off with a tool such as a blade, so that the display panel 2 may be easily detached from the backplane 1. In this way, convenience of disassembly, assembly and maintenance of the display panel 2 may be improved.

As shown in FIGS. 4A to 4D, in some embodiments, the display module 100 further includes an insulating sheet 7 and a driving circuit board 25. The insulating sheet 7 is disposed on the surface of the backplane 1 facing the display panel 2, and the driving circuit board 25 is disposed on the back surface 22 of the display panel 2. As shown in FIG. 4B, the back surface 22 of the display panel 2 has a placement region 26, and the placement region 26 is configured to provide the driving circuit board 25. The insulating sheet 7 is aligned with a placement region 26. That is, the placement region 26 is located within an orthogonal projection of the insulating sheet 7 on the back surface 22 of the display panel 2. The insulating sheet 7 may keep the driving circuit board 25 and the backplane 1 insulated. In the case where the backplane 1 is the metal backplane, it may avoid a short circuit of the driving circuit board 25 due to contact with the backplane 1, thereby ensuring normal operation of the display panel 2.

For example, the driving circuit board 25 is disposed on the second panel edge sub-region 222.

Figure 5:
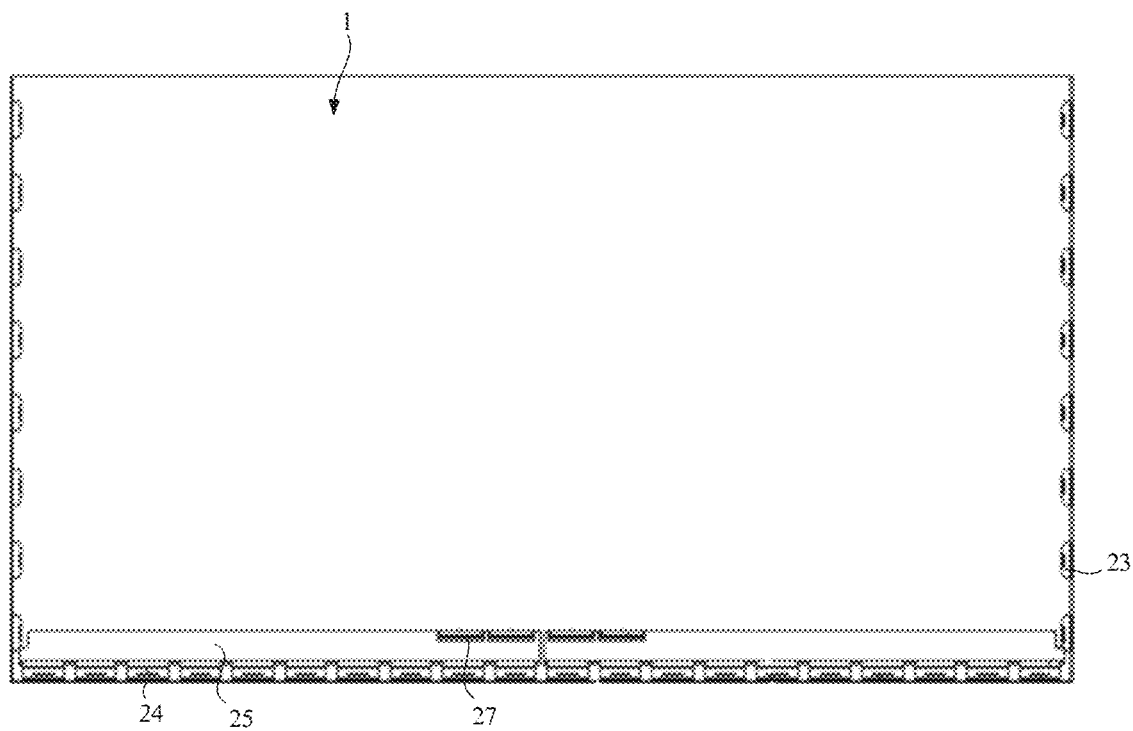
FIG. 5 is a rear view of yet another display panel, in accordance with some embodiments.

As shown in FIGS. 4B, 4D and 5, the display module 100 further includes second connection circuit boards 24, A side of the second connection circuit board 24 is bonded to the display panel 2, and another side thereof is electrically connected to the driving circuit board 25. For example, the second connection circuit board 24 includes a flexible circuit board and source driver IC(s) disposed on the flexible circuit board. For another example, the second connection circuit board 24 includes a thin film and source driver IC(s) disposed on the thin film.

In some embodiments, as shown in FIGS. 4B and 4D, the driving circuit board 25 is further provided with telecommunication interface terminals 27. As shown in FIGS. 4A and 4C, the backplane 1 is provided with a connection port 14 is disposed at a position corresponding to the telecommunication interface terminals 27. In this way, connection lines connected to the telecommunication interface terminals 27 may be led out from a back of the backplane 1 through the connection port 14.

Figure 10:
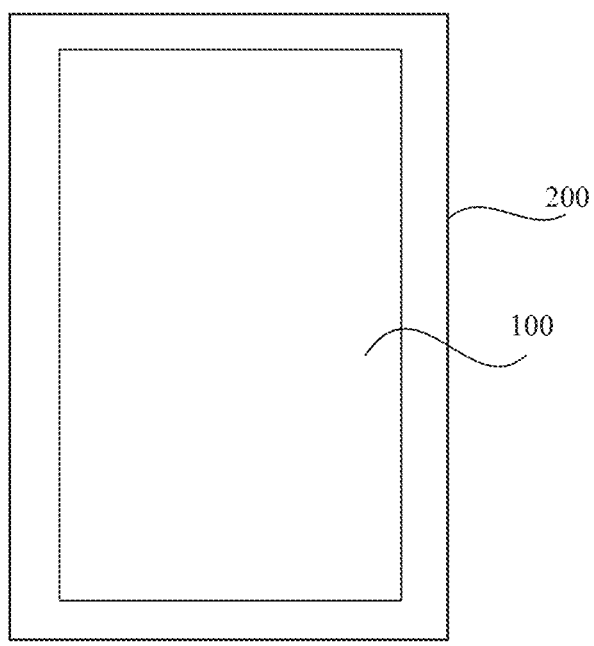
FIG. 10 is a schematic diagram of a display device, in accordance with some embodiments.

As shown in FIG. 10, some embodiments of the present disclosure provide a display device 300 including a housing 200 and the above display module 100. The display module 100 is disposed in the housing 200.

The display device 300 may be a flat display device or a curved display device, which is not specifically limited here. The display device 300 may be used as any product or component with a display function, such as a mobile phone, a tablet computer, a personal digital assistant (FDA), a digital photo frame, a navigator, or a vehicle-mounted computer. The embodiments of the present disclosure do not particularly limit the use of the display device 300.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure, Therefore, the protection scope of the present disclosure shall be subject to the protection scope of the claims.

What is claimed is:

1. A display module, comprising:
a display panel having a light exit surface and a back surface opposite to the light exit surface;
a backplane disposed at a side of the display panel away from the light exit surface;
a magnetic attraction structure disposed between the display panel and the backplane, the magnetic attraction structure being configured to attract and fix the display panel and the backplane; and
a plurality of bonding portions disposed between the display panel and the backplane, wherein the plurality of bonding portions are spaced apart, and are configured to bond the display panel to the backplane;
wherein the backplane is provided with a plurality of through holes, and each bonding portion is disposed at an edge of a corresponding through hole close to the display panel;
orthographic projection of the magnetic attraction structure on the display panel does not overlap with orthographic projections of the plurality of bonding portions on the display panel;
the display module has a central region and an edge region surrounding the central region; the magnetic attraction structure includes at least one first magnetic attraction component and at least one second magnetic attraction component, the at least one first magnetic attraction component is disposed in the central region, and the at least one second magnetic attraction component is disposed in the edge region; and a magnetic attraction force of the at least one first magnetic attraction component is less than a magnetic attraction force of the at least one second magnetic attraction component;
the at least one second magnetic attraction component includes a plurality of second magnetic attraction components that are spaced apart, and a material of the plurality of second magnetic attraction components includes metal;
the edge region includes two first edge sub-regions disposed on two opposite sides of the central region in a first direction and two second edge sub-regions disposed on two opposite sides of the central region in a second direction; the first direction is a direction in which a side of the display panel extends, the second direction is a direction in which another side of the display panel extends, and the side and the another side are two adjacent sides of the display panel;
the plurality of second magnetic attraction components are divided into a first group of magnetic attraction components and a second group of magnetic attraction components, and each of the first group of magnetic attraction components and the second group of magnetic attraction components includes second magnetic attraction components; the first group of magnetic attraction components is disposed in the two first edge sub-regions, and the second group of magnetic attraction components is disposed in the two second edge sub-regions;
the backplane is a metal backplane; and the first group of magnetic attraction components is fixedly disposed on the display panel, and the second group of magnetic attraction components is fixedly disposed on the backplane; and
the display module further includes:
two auxiliary magnetic attraction components, one of the two auxiliary magnetic attraction components being disposed in one second edge sub-region, and another of the two auxiliary magnetic attraction components being disposed in another second edge sub-region; and
a second bonding layer having two bonding surfaces, one of the two bonding surfaces being bonded to the display panel, and another of the two bonding surfaces being bonded to the two auxiliary magnetic attraction components,
wherein orthogonal projections, on the display panel, of all second magnetic attraction components in the second group of magnetic attraction components in each second edge sub-region are within an orthogonal projection, on the display panel, of an auxiliary magnetic attraction component in the second edge sub-region; and the auxiliary magnetic attraction component is configured to be magnetically attracted to all second magnetic attraction components in the second edge sub-region.

2. The display module according to claim 1, wherein the plurality of bonding portions are disposed in the edge region.

3. The display module according to claim 1, wherein the at least one first magnetic attraction component is made of a flexible material;
- each first magnetic attraction component is of a plate-shaped structure; and
- the at least one first magnetic attraction component includes a plurality of first magnetic attraction components, and the plurality of first magnetic attraction components are arranged in an array.

4. The display module according to claim 1, wherein the at least one first magnetic attraction component is fixedly disposed on the backplane.

5. The display module according to claim 4, further comprising a first bonding layer having two bonding surfaces, one of the two bonding surfaces being bonded to the backplane, and another of the two bonding surfaces being bonded to the at least one first magnetic attraction component.

6. The display module according to claim 1, wherein the two auxiliary magnetic attraction components are both metal sheets.

7. The display module according to claim 1, wherein the plurality of bonding portions are located between the two auxiliary magnetic attraction components and the backplane.

8. The display module according to claim 1, wherein the backplane is a curved backplane; and
- the first direction is parallel to a direction perpendicular to an uncurved side of the curved backplane.

9. The display module according to claim 1, wherein a material of the plurality of bonding portions includes a neutral transparent glass adhesive.

10. The display module according to claim 1, further comprising an insulating sheet disposed on the backplane, wherein the back surface of the display panel has a placement region configured to provide a driving circuit board, and the placement region is located within an orthogonal projection of the insulating sheet on the back surface of the display panel.

11. A display device, comprising a housing and the display module according to claim 1, the display module being disposed in the housing.

12. A display module, comprising:
- a display panel having a light exit surface and a back surface opposite to the light exit surface;
- a backplane disposed at a side of the display panel away from the light exit surface;
- a magnetic attraction structure disposed between the display panel and the backplane, the magnetic attraction structure being configured to attract and fix the display panel and the backplane; and
- a plurality of bonding portions disposed between the display panel and the backplane, wherein the plurality of bonding portions are spaced apart, and are configured to bond the display panel to the backplane;
- wherein the backplane is provided with a plurality of through holes, and each bonding portion is disposed at an edge of a corresponding through hole close to the display panel;
- orthographic projection of the magnetic attraction structure on the display panel does not overlap with orthographic projections of the plurality of bonding portions on the display panel;
- the display module has a central region and an edge region surrounding the central region; the magnetic attraction structure includes at least one first magnetic attraction component and at least one second magnetic attraction component, the at least one first magnetic attraction component is disposed in the central region, and the at least one second magnetic attraction component is disposed in the edge region; and a magnetic attraction force of the at least one first magnetic attraction component is less than a magnetic attraction force of the at least one second magnetic attraction component;
- the at least one second magnetic attraction component includes a plurality of second magnetic attraction components that are spaced apart, and a material of the plurality of second magnetic attraction components includes metal;
- the edge region includes two first edge sub-regions disposed on two opposite sides of the central region in a first direction and two second edge sub-regions disposed on two opposite sides of the central region in a second direction; the first direction is a direction in which a side of the display panel extends, the second direction is a direction in which another side of the display panel extends, and the side and the another side are two adjacent sides of the display panel;
- the plurality of second magnetic attraction components are divided into a first group of magnetic attraction components and a second group of magnetic attraction components, and each of the first group of magnetic attraction components and the second group of magnetic attraction components includes second magnetic attraction components; the first group of magnetic attraction components is disposed in the two first edge sub-regions, and the second group of magnetic attraction components is disposed in the two second edge sub-regions;
- the first group of magnetic attraction components and the second group of magnetic attraction components are both fixedly disposed on the backplane; and
- the display module further includes:
- two auxiliary magnetic attraction components, one of the two auxiliary magnetic attraction components being disposed in one second edge sub-region, and another of the two auxiliary magnetic attraction components being disposed in another second edge sub-region; and
- a second bonding layer having two bonding surfaces, one of the two bonding surfaces being bonded to the display panel, and another of the two bonding surfaces being bonded to the two auxiliary magnetic attraction components, wherein orthogonal projections, on the display panel, of all second magnetic attraction components in the second group of magnetic attraction components in each second edge sub-region are within an orthogonal projection, on the display panel, of an auxiliary magnetic attraction component in the second edge sub-region; and
- the auxiliary magnetic attraction component is configured to be magnetically attracted to all second magnetic attraction components in the second edge sub-region.

13. The display module according to claim 12, further comprising:
- two auxiliary connection structures, one of the two auxiliary connection structures being disposed in one first edge sub-region, and another of the two auxiliary connection structures being disposed in another first edge sub-region; and
- a third bonding layer having two bonding surfaces, one of the two bonding surfaces being bonded to the display panel, and another of the two bonding surfaces being bonded to the two auxiliary connection structures, wherein orthogonal projections, on the display panel, of all second magnetic attraction components in the first group of magnetic attraction components in each first edge sub-region are within an orthogonal projection, on the display panel, of an auxiliary connection structure in the first edge sub-region; and the auxiliary connection structure is configured to be magnetically attracted to all second magnetic attraction components in the first edge sub-region.

* * * * *

UNITED STATES PATENT AND TRADEMARK OFFICE
CERTIFICATE OF CORRECTION

PATENT NO. : 12,262,582 B2
APPLICATION NO. : 17/612288
DATED : March 25, 2025
INVENTOR(S) : Zifeng Wang, Lei Cao and Yao Zhang It is certified that error appears in the above-identified patent and that said Letters Patent is hereby corrected as shown below:

In the Specification

Column 5, Line 23, number "28" in "FIGS. 2A and 28" should be "2B".

Column 5, Line 55, "(Go)" in "a cobalt (Go) element" should be "(Co)".

Column 10, Line 51, "40" in "FIGS. 4B and 40" is should be "4D".

Signed and Sealed this
Sixteenth Day of September, 2025

Coke Morgan Stewart
*Acting Director of the United States Patent and Trademark Office*